(12) United States Patent
Chang et al.

(10) Patent No.: US 9,029,826 B2
(45) Date of Patent: May 12, 2015

(54) PHASE CHANGE MEMORY INCLUDING OVONIC THRESHOLD SWITCH WITH LAYERED ELECTRODE AND METHODS FOR FORMING THE SAME

(71) Applicant: Micron Technology, Inc., Boise, ID (US)

(72) Inventors: Kuo-Wei Chang, Cupertino, CA (US); Jinwook Lee, Cupertino, CA (US); Jong-Won Lee, Boise, ID (US); Elijah V. Karpov, Portland, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/013,361

(22) Filed: Aug. 29, 2013

(65) Prior Publication Data
US 2013/0344676 A1 Dec. 26, 2013

Related U.S. Application Data

(63) Continuation of application No. 12/774,772, filed on May 6, 2010, now Pat. No. 8,530,875.

(51) Int. Cl.
*G11C 11/00* (2006.01)
*H01L 45/00* (2006.01)

(52) U.S. Cl.
CPC ............... *H01L 45/16* (2013.01); *H01L 45/06* (2013.01); *H01L 45/1253* (2013.01); *H01L 45/126* (2013.01); *H01L 45/141* (2013.01); *H01L 45/1675* (2013.01)

(58) Field of Classification Search
CPC ............ H01L 27/2427; H01L 45/1273; H01L 45/1253; H01L 45/16; H01L 45/06; H01L 45/126; H01L 45/141; H01L 45/1675; G11C 2213/52

USPC .......... 257/2–4, E47.001, E45.002; 365/148, 365/163
See application file for complete search history.

(56) References Cited

U.S. PATENT DOCUMENTS

| 4,845,533 | A | | 7/1989 | Pryor et al. | |
|---|---|---|---|---|---|
| 5,414,271 | A | * | 5/1995 | Ovshinsky et al. | 257/3 |
| 5,714,768 | A | * | 2/1998 | Ovshinsky et al. | 257/40 |
| 5,920,122 | A | | 7/1999 | Matsumoto et al. | |

(Continued)

FOREIGN PATENT DOCUMENTS

WO 2013/039496 A1 3/2013

OTHER PUBLICATIONS

Park et al., "Comparison of TiN and TiN/Ti/TiN Multilayer Films for Diffusion Barrier Applications", Journal of the Korean Physical Society, vol. 42, No. 6, Jun. 2003, pp. 817-820.*

(Continued)

*Primary Examiner* — Peter Bradford
(74) *Attorney, Agent, or Firm* — Dorsey & Whitney LLP

(57) ABSTRACT

Erosion of chalcogenides in phase change memories using ovonic threshold switch selectors can be reduced by controlling columnar morphology in electrodes used in the ovonic threshold switch. The columnar morphology may cause cracks to occur which allow etchants used to etch the ovonic threshold switch to sneak through the ovonic threshold switch and to attack chalcogenides, either in the switch or in the memory element. In one embodiment, the electrode may be split into two metal nitride layers separated by an intervening metal layer.

24 Claims, 1 Drawing Sheet

(56) References Cited

U.S. PATENT DOCUMENTS

| | | | |
|---|---|---|---|
| 7,332,735 B2 | 2/2008 | Campbell | |
| 7,804,083 B2 | 9/2010 | Chen | |
| 8,237,146 B2 | 8/2012 | Kreupl et al. | |
| 8,263,455 B2 | 9/2012 | Park et al. | |
| 2004/0037179 A1 | 2/2004 | Lee | |
| 2005/0023581 A1 | 2/2005 | Nuetzel et al. | |
| 2006/0091492 A1* | 5/2006 | Lee et al. | 257/467 |
| 2006/0237756 A1 | 10/2006 | Park et al. | |
| 2006/0246712 A1 | 11/2006 | Kim et al. | |
| 2006/0255328 A1 | 11/2006 | Dennison | |
| 2007/0096090 A1* | 5/2007 | Dennison | 257/42 |
| 2007/0158698 A1* | 7/2007 | Dennison et al. | 257/246 |
| 2007/0210296 A1 | 9/2007 | Cote et al. | |
| 2008/0020508 A1* | 1/2008 | Dennison | 438/102 |
| 2008/0067486 A1* | 3/2008 | Karpov et al. | 257/3 |
| 2008/0102560 A1 | 5/2008 | Hamamjy et al. | |
| 2008/0121862 A1 | 5/2008 | Liu | |
| 2008/0137262 A1 | 6/2008 | Mahalingam et al. | |
| 2008/0142984 A1 | 6/2008 | Chen | |
| 2009/0014705 A1 | 1/2009 | Hsu et al. | |
| 2009/0050872 A1* | 2/2009 | Kuo et al. | 257/3 |
| 2009/0122588 A1 | 5/2009 | Chen | |
| 2009/0194758 A1 | 8/2009 | Chen | |
| 2009/0218557 A1* | 9/2009 | Sato | 257/3 |
| 2009/0246952 A1 | 10/2009 | Ishizaka et al. | |
| 2009/0298222 A1* | 12/2009 | Lowrey et al. | 438/102 |
| 2009/0298224 A1* | 12/2009 | Lowrey | 438/102 |
| 2010/0032638 A1 | 2/2010 | Xu | |
| 2010/0163818 A1* | 7/2010 | Lee et al. | 257/2 |
| 2011/0007545 A1 | 1/2011 | Jin et al. | |
| 2011/0147695 A1 | 6/2011 | Lee et al. | |
| 2012/0224413 A1 | 9/2012 | Zhang et al. | |
| 2014/0239245 A1 | 8/2014 | Lengade et al. | |

OTHER PUBLICATIONS

International Search Report for PCT Application No. PCT/US2011/051600 dated May 1, 2012.

* cited by examiner

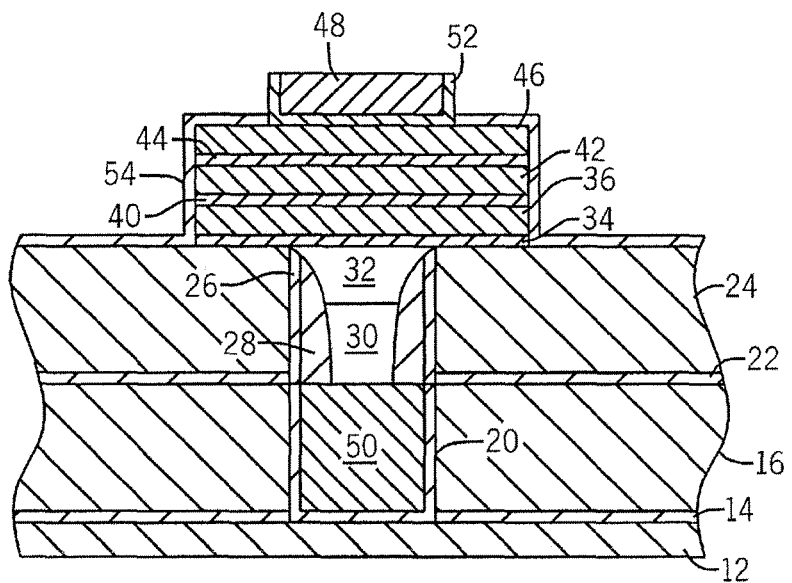

PHASE CHANGE MEMORY INCLUDING OVONIC THRESHOLD SWITCH WITH LAYERED ELECTRODE AND METHODS FOR FORMING THE SAME

CROSS REFERENCE TO RELATED APPLICATIONS

This application is a continuation of U.S. patent application Ser. No. 12/774,772, filed May 6, 2010, which application is incorporated herein by reference in its entirety, for any purpose.

BACKGROUND OF THE INVENTION

This relates generally to phase change memories.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

BRIEF DESCRIPTION OF THE DRAWINGS

FIG. 1 is an enlarged, cross-sectional view of one embodiment of the present invention.

DETAILED DESCRIPTION

In accordance with some embodiments, erosion of chalcogenide during the etching of overlying stacks may be reduced through appropriate design of overlying electrode layers. Particularly, electrodes used in connection with overlying ovonic threshold switches may be prone to the formation of cracks. It is believed, without being limited by theory, that these cracks are the result of columnar morphology of metal nitride electrodes.

The columnar structures in metal nitride electrode film may be grains or grain-like nanostructures. Thus, the cracks may be formed at grain or grain-like nanostructure boundaries. The grain-like nanostructures may be crystallites, for example.

The columnar morphology results in vertical cracks which may allow etchant materials to sneak through these cracks and to etch out underlying chalcogenide material which may be highly susceptible to the etchants used to etch overlying stacks of materials.

Undesired erosion of chalcogenides may be reduced by reducing the thickness of the overlying metal nitride electrodes. Reducing their thickness reduces their tendency to form columnar morphology. In some embodiments, the electrode may be split into two separate sub-layers, for example, separated by an intervening layer of a different material. The layer of a different material may also interfere with the formation of columnar morphology. In addition, even if the constituent sub-layers form cracks, it is unlikely that the cracks would line up sufficiently to allow etchant penetration through both sub-layers.

Particularly, if a relatively thin layer of metal is applied between the two sub-layers of metal nitride, the columnar morphology may be disrupted and, if not, the formation of cracks completely through both sub-layers is unlikely. Thus, as an example, when a metal nitride is used for the electrode, that same metal may be used as the intervening layer, providing the desired disruption of the columnar morphology or penetrating cracks and good adherence to the nitride in some embodiments.

Thus, referring to FIG. 1, a phase change memory cell, in accordance with one embodiment, may include a phase change memory element in series with an overlying ovonic threshold switch that functions as a select device. A phase change memory may include an array of cells coupled by row lines and bitlines.

A first address line 12 at the bottom may extend from left to right. A second address line 48 at the top may extend into the page perpendicularly to the first address line 12. One address line may be a row line and the other address line may be a perpendicularly oriented bitline.

Above the lower address line 12 may be a heater 50 which, in one embodiment, may be titanium silicon nitride. The heater 50 may be isolated using tantalum nitride barrier layer 20. The heater 50 may be encased within a pore formed of two layers of distinct dielectrics 14 and 16. For example, the layer 14 may be nitride and the layer 16 may be oxide.

Similarly, another pore above the heater may be filled with additional heater material 30 and a chalcogenide material 32. That pore may be defined by two different dielectric layers 22 and 24. For example, the lower dielectric layer 22 may be nitride and the upper dielectric layer 24 may be oxide. Likewise, sidewall spacers may reduce the size of the pore. For example, an outer sidewall spacer 26 may enclose an inner sidewall spacer 28. The outer sidewall spacer 26 may, for example, be oxide and the inner sidewall spacer 28 may, for example, be nitride.

Above this structure may be an ovonic threshold switch, in one embodiment. The ovonic threshold switch may include a first electrode 34 which, in one embodiment, may be titanium aluminum nitride. The next layer 36 may include a chalcogenide that forms the ovonic threshold switch. This is followed by a layer 40 which, in one embodiment, may be carbon. A layer 42 may be an electrode layer formed of a metal nitride, such as titanium nitride. A second electrode layer 46 may be formed above the first electrode layer 42, separated by an intervening conductor 44. In some embodiments, the electrode layers 42 and 46 may be formed of a conductive material other than a metal nitride, including a metal without nitride.

The conductor 44 may be formed of the same metal used to form the metal nitride of the layers 42 and 46 in some embodiments. Generally, the layers 42 and 46 may be of the same material, but this is not necessarily so. The intervening conductor 44 may serve, in some embodiments, to break up the columnar structure of the metal nitride layers 42 and 46 by disrupting columns that would otherwise form across the layers 42 and 46 and by enabling reduced thicknesses of those layers. The upper layer 46 may be masked and the entire stack etched using suitable etchants. As a result, the edges of the layers 34, 36, 40, 42, 44, and 46 are aligned. The stack of aligned layers may be covered by a sealing layer 54 in some embodiments.

The erosion of chalcogenide in the layers 32 and/or 36, through cracks formed due to the columnar morphology, may be reduced by reducing the thickness of the layers 42 and 46 by breaking them into two layers and by providing the intervening conductor 44 that is of a different material than the material used for the layers 42 and 46, in some embodiments.

In some embodiments, the thicknesses of the layers 42 and 46 may be less than 350 Angstroms. The intervening conductor 44 may be from 20 to 100 Angstroms thick in some embodiments. In one embodiment, the conductor 44 is about 50 Angstroms thick. It is desirable that the intervening layer be relatively thin, in some embodiments, to reduce the formation of columnar morphology in that layer as well.

In some embodiments, the upper address line 48 may be isolated using a tantalum nitride layer 52, particularly when the upper address line 48 is formed of a copper material. Copper may migrate down through the chalcogenides 32 and/or 36 causing damage. Damage from the lower address line 12 may be reduced in cases where the lower address line 12 is copper by encasing the heater 50 in a tantalum nitride or other barrier layer 20.

The columnar morphology referred to herein may loosely be the result of columnar shaped grains that may be formed within the metal nitride structure. These columnar grains may be vertically oriented, providing vertical paths down through the metal nitride. These paths may be referred to as cracks. As a result, etchants may penetrate through these cracks and travel downwardly all the way down to the chalcogenide. The chalcogenide may be eroded during the etching of the overlying stack used to form the ovonic threshold switch.

More than two metal nitride layers with more than one separating metal layer may be used in some embodiments.

Using the same metal for the layer 44 as is used for the layers 42 and 46 may be advantageous in some cases. It enables all three layers to be formed in the same deposition chamber. It allows the same targets to be used in some cases. And, in some cases, the conductor 44 may adhere better to its own metal nitrides than would other metals. However, different metals may be used in the layers 42, 44, and 46 in some embodiments.

Programming to alter the state or phase of the material may be accomplished by applying voltage potentials to the address lines 12 and 48, thereby generating a voltage potential across a memory element including a phase change material 32. When the voltage potential is greater than the threshold voltages of any select device and memory element, then an electrical current may flow through the phase change material 32 in response to the applied voltage potentials, and may result in heating of the phase change material 32.

This heating may alter the memory state or phase of the material 32, in one embodiment. Altering the phase or state of the material 32 may alter the electrical characteristic of memory material, e.g., the resistance or threshold voltage of the material may be altered by altering the phase of the memory material. Memory material may also be referred to as a programmable resistance material.

In the "reset" state, memory material may be in an amorphous or semi-amorphous state and in the "set" state, memory material may be in a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to melt and then quenched to vitrify and "reset" memory material in an amorphous state (e.g., program memory material to a logic "0" value). Heating the volume of memory material to a relatively lower crystallization temperature may crystallize or devitrify memory material and "set" memory material (e.g., program memory material to a logic "1" value). Various resistances of memory material may be achieved to store information by varying the amount of current flow and duration through the volume of memory material.

The ovonic threshold switch is either on or off depending on the amount of voltage potential applied across the switch and, more particularly, whether the current through the switch exceeds its threshold current or voltage, which then triggers the device into an on state. The off state may be substantially electrically nonconductive and the on state may be a substantially conductive state with less resistance than the off state. In the on state, the voltage across the switch, in one embodiment, is equal to its holding voltage $V_{hold}$ '$R_{on}$/where $R_{on}$ is the dynamic resistance from the extrapolated X axis intercept $V_{hold}$. For example, an ovonic threshold switch may have a threshold voltage $V_{th}$ and, if a voltage potential less than the threshold voltage of the switch is applied across the switch, then the switch may remain off or in a relatively high resistance state so that little or no electrical current passes.

Alternatively, if a voltage potential greater than the threshold voltage of the select device is applied across the device, then the device may turn on, i.e., operate in a relatively low resistance state so that significant electrical current passes through the switch. In other words, one or more series connected switches may be in a substantially electrically nonconductive state at less than a predetermined voltage, e.g., the threshold voltage as applied across a switch. The switch may be in a substantially conductive state if greater than a predetermined voltage is applied across the switch. In one embodiment, each switch may comprise a switch material 36 that is a chalcogenide alloy. The switch material may be a material in a substantial amorphous state positioned between two electrodes that may be repeatedly and reversibly switched between a higher resistance off state that is generally greater than about 1 megaOhms and a relatively lower resistance on state that is generally less than about 1000 Ohms in series with the holding voltage by the application of electrical current or potential.

Each switch is a two-terminal device that has an IV curve similar to that of a phase change memory element that is in an amorphous state. However, unlike a phase change memory element, the ovonic threshold switch does not change phase. That is, the switching material of the ovonic threshold switch is not a phase programmable material and, as a result, the switch may not be a memory device capable of storing information. For example, the switching material may remain permanently amorphous and the IV characteristics may remain the same throughout the operating life.

In the low voltage, low electric field mode, where the voltage applied across the switch is less than the threshold voltage $V_{th}$; the switch may be off or non-conducting and exhibits a relatively high resistance. The switch may remain in the off state until a sufficient voltage, namely, the threshold voltage, is applied or a sufficient current is applied, namely, the threshold current, that switches the device to a conductive relatively low resistance on state. After a voltage potential of greater than about the threshold voltage is applied across the device, the voltage potential across the device may drop or snapback to a holding voltage $V_{hold}$. Snapback may refer to the voltage difference between the threshold voltage and the holding voltage of the switch.

In the on state, the voltage potential across the switch may remain close to the holding voltage as current passing through the switch is increased. The switch may remain on until the current through the switch drops below a holding current. Below this value, the switch may turn off and return to a relatively high resistance, non-conductive off state, until the threshold voltage and current are again exceeded.

In some embodiments, only one switch may be used. In other embodiments, two or more series connected switches may be used.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed:

1. A method comprising:
   forming a phase change memory element including a phase change memory material in contact with a plurality of heaters, wherein a first one of the plurality of heaters having a cross-sectional area different than a cross-sectional area of a second one of the plurality of heaters;
   forming a first electrode having a layer of a metal nitride material over the phase change memory material, wherein a first portion of the layer of the metal nitride material contacts a portion of the phase change memory material;
   forming a chalcogenide material over the first electrode, wherein a portion of the chalcogenide material contacts a second portion of the layer of the metal nitride material of the first electrode;
   forming a carbon layer overlaying the chalcogenide material; and
   forming a second electrode overlaying the carbon layer, the second electrode including at least two metal nitride layers separated by an intervening metal layer.

2. The method of claim 1, wherein forming the second electrode overlaying the carbon layer comprises:
   forming a first metal nitride layer;
   forming the intervening metal layer over the first metal nitride layer; and
   forming a second metal nitride layer over the intervening layer.

3. The method of claim 2, wherein the first metal nitride layer and the second metal nitride layer are formed using a same metal nitride material.

4. The method of claim 3, wherein the metal nitride material is titanium nitride.

5. The method of claim 2, wherein the intervening metal layer is formed from a same metal as the first metal nitride layer or the second metal nitride layer.

6. The method of claim 2, wherein forming the first and second metal nitride layers comprises forming the first and second metal nitride layers free from a columnar morphology.

7. The method of claim 1, wherein forming the second electrode overlaying the carbon layer comprises forming the second electrode having layers with thicknesses that prevent leakage through the second electrode.

8. The method of claim 1, wherein forming the second electrode overlaying the carbon layer comprises forming the second electrode having layers with thicknesses of less than 350 Angstroms.

9. The method of claim 1, wherein forming the second electrode overlaying the carbon layer comprises forming the second electrode having layers with thicknesses that prevent etchant used to etch the second electrode from passing through the second electrode and etching the chalcogenide material.

10. The method of claim 1, wherein the first electrode, the chalcogenide material, the carbon layer, and the second electrode form an ovonic threshold switch stack.

11. The method of claim 1, further comprising:
    forming a barrier layer along sidewalls of the first one of the plurality of heaters; and
    forming a spacer layer aligned with sidewalls of the second one of the plurality of heaters, wherein vertical portions of the barrier layer are horizontally aligned with vertical portions of the spacer layer.

12. The method of claim 1, wherein the metal nitride material of the first electrode is a titanium aluminum nitride.

13. A method comprising:
    forming a phase change memory element including a phase change memory material overlying a first heater and a second heater, wherein the first heater has a cross-sectional area different than a cross-sectional area of a the second heater; and
    forming an ovonic threshold switch overlaying the phase change memory element including a first electrode, a second electrode, and a chalcogenide material, wherein the second electrode comprises two metal nitride layers separated by an intervening metal layer, wherein a first portion of a layer of a metal nitride material of the first electrode contacts a portion of the chalcogenide material and a second portion of the layer of the metal nitride material contacts a portion of the phase change memory material.

14. The method of claim 13, wherein the forming the ovonic threshold switch comprises:
    forming the first electrode over the phase change memory material;
    layering the chalcogenide material over the first electrode;
    forming a first metal nitride layer over the chalcogenide material;
    forming a metal layer over the first metal nitride layer;
    forming a second metal nitride layer over the metal layer; and
    etching the first electrode, chalcogenide material, first metal nitride layer, metal layer, and second metal nitride layer.

15. The method of claim 14, wherein the metal of the metal layer formed between the first and second metal nitride layers is the same as the metal of at least one of the first or second metal nitride layers.

16. The method of claim 14, wherein forming the first and second metal nitride layers comprises forming the first and second metal nitride layers using titanium nitride.

17. The method of claim 14, wherein forming the first and second metal nitride layers comprises forming the first and second metal nitride layers free from a columnar morphology.

18. The method of claim 13, wherein the metal nitride material of the first electrode is a titanium aluminum nitride.

19. The method of claim 13, further comprising:
    forming a first heater;
    forming a second heater overlaying the first heater;

forming a phase change memory material over the second heater; and wherein forming an ovonic threshold switch includes:

forming the first electrode overlaying the phase change memory material;

layering the chalcogenide material over the first electrode; and forming the second electrode over the chalcogenide material.

20. The method of claim 19, wherein forming the first heater comprises forming the first heater within a first pore in a first plurality of dielectric layers, wherein the first heater is separated from the dielectric layers by a barrier layer.

21. The method of claim 20, wherein forming the second heater comprises forming the second heater in a second pore in a second plurality of dielectric layers, wherein the second plurality of dielectric layers is formed over the first plurality of dielectric layers in contact with the first heater.

22. The method of claim 21, wherein forming the phase change memory material over the second heater comprises filling a remainder of the second pore with the phase change memory material.

23. The method of claim 22, further comprising reducing a size of the second pore by forming a spacer adjacent to side walls of the second pore.

24. The method of claim 23, wherein the spacer comprises two different dielectric layers.

* * * * *